(12) United States Patent
Leonardi

(10) Patent No.: US 6,495,423 B1
(45) Date of Patent: Dec. 17, 2002

(54) ELECTRONIC POWER DEVICE MONOLITHICALLY INTEGRATED ON A SEMICONDUCTOR AND COMPRISING EDGE PROTECTION STRUCTURES HAVING A LIMITED PLANAR DIMENSION

(75) Inventor: Salvatore Leonardi, Aci S. Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 48 days.

(21) Appl. No.: 09/613,108

(22) Filed: Jul. 10, 2000

(30) Foreign Application Priority Data

Aug. 26, 1999 (EP) .............................. 99830532

(51) Int. Cl.$^7$ ......................................... H01L 21/8236
(52) U.S. Cl. ............................ 438/278; 438/31; 438/61; 438/63; 438/202; 438/205; 438/234; 438/580
(58) Field of Search .................................. 438/278, 202, 438/205, 234, 31, 580, 63, 61

(56) References Cited

U.S. PATENT DOCUMENTS

| | | | |
|---|---|---|---|
| 3,878,551 A | 4/1975 | Callahan, Jr. ............... 357/48 |
| 4,965,215 A | * 10/1990 | Zambrano et al. ........... 437/31 |
| 5,308,786 A | 5/1994 | Lur et al. .................... 437/64 |
| 5,374,583 A | 12/1994 | Lur et al. .................... 437/67 |
| 5,408,124 A | * 4/1995 | Palara ....................... 257/580 |
| 5,650,354 A | 7/1997 | Himi et al. ................. 437/63 |
| 5,877,050 A | 3/1999 | Gardner et al. ............ 438/231 |
| 6,033,947 A | 3/2000 | Cacciola et al. ............ 438/202 |
| 6,040,208 A | 3/2000 | Honeycutt et al. .......... 438/229 |

FOREIGN PATENT DOCUMENTS

| | | |
|---|---|---|
| EP | 0509183 | 10/1992 |
| EP | 0735580 | 10/1996 |
| JP | 58161342 | 9/1983 |
| JP | 59112633 | 6/1984 |
| JP | 61-110446 | 5/1986 |
| JP | 2-68949 | 3/1990 |

\* cited by examiner

*Primary Examiner*—Richard Elms
*Assistant Examiner*—Pho M. Luu
(74) *Attorney, Agent, or Firm*—Lisa K. Jorgenson; Robert Iannucci; Seed IP Law Group PLLC

(57) ABSTRACT

An electronic power device is integrated monolithically in a semiconductor substrate. The device includes a power region, itself having at least one P/N junction provided therein which comprises a first semiconductor region with a first type of conductivity extending into the substrate from the top surface of the device and being diffused into a second semiconductor region with the opposite conductivity from the first; and an edge protection structure of substantial thickness and limited planar size incorporating at least one trench filled with dielectric material. A method of manufacturing the electronic power device includes forming a silicon oxide trench, provided as the edge protection structure, by the following steps: forming a plurality of small trenches in the substrate which have predetermined lengths and are bounded by a plurality of corresponding walls of semiconductor material having predetermined widths; and oxidizing the semiconductor by means of a thermal process in order to oxidize the walls and produce the oxide trench.

12 Claims, 5 Drawing Sheets

ELECTRONIC POWER DEVICE MONOLITHICALLY INTEGRATED ON A SEMICONDUCTOR AND COMPRISING EDGE PROTECTION STRUCTURES HAVING A LIMITED PLANAR DIMENSION

TECHNICAL FIELD

This invention relates to an electronic power monolithically integrated on a semiconductor substrate and having edge protection structure limited planar size.

The invention specifically relates to a monolithic semiconductor device wherein P/N junctions are capable of sustaining high operating voltages, a base-collector junction of an NPN bipolar transistor being exemplary of these.

The invention further relates to a method of manufacturing the protection structure of limited planar size.

The invention relates, particularly but not exclusively, to a structure of limited planar size which functions as an edge structure for a VIPOWER type of power device, and the description to follow will make reference to this field of application for convenience of illustration only.

BACKGROUND OF THE INVENTION

As is known, in semiconductor electronic devices, most of the P/N junctions fabricated with planar technology comprise basically a first semiconductor region having a first type of conductivity and being diffused into a second semiconductor region with the opposite type of conductivity from the first. An insulating layer of silicon oxide is laid over both regions, and metal contacts are then formed to establish an electric connection to the two semiconductor regions.

A depleted region is associated with the P/N junction. This depleted region can be regarded as formed of two regions: a first region along a planar region of the junction, and the second region at the edges of the planar region.

In the planar region, the equipotential lines lie parallel to the junction, the peak electric field is centered at the junction, and the field breakdown occurs upon the field reaching its critical value. Referring to FIG. 1, the equipotential lines curve and are more crowded together at the junction edges than in the planar region, due to the junction depth being finite. Consequently, the electric field at the edge region is increased; stronger electric fields being associated with smaller radii of curvature.

The breakdown voltage of a finite P/N junction is usually lower than that associated with the corresponding planar junction because of the electric field being much stronger at the edge region. The breakdown voltage ratio between the edge and the planar portion is, therefore, smaller than unity. Thus, an ability to define and implement technical solutions which can limit the drop in the critical electric field at the edge regions of the structure acquires special importance.

A first prior approach to filling this demand provided for the use of metal field plates located proximate to the structure edge. The field plates are not in direct contact with the silicon surface, but rest on the previously deposited, or grown, layer of silicon oxide.

Referring to FIG. 2, a major feature of metal layers immersed in an electric field is that they are set at a single potential throughout their spread. Accordingly, the metal field plates, if suitably dimensioned, will force the depleted region to span a large area, thus preventing crowding of the equipotential lines.

While being in several ways advantageous, this first of the prior approaches has certain drawbacks. For devices which are to endure high operating voltages, the surface electric field still remains high, and even if below the critical value, may be sensitive to the amount of surface charge brought about by the presence of moving charges or fixed charges at the oxide/silicon interface, introduced during the process steps for manufacturing the power devices.

A second prior approach, disclosed in GB-A-216597, proposes high-resistivity rings placed in electric contact with the main junction to be protected. Referring to FIG. 3, this approach, by forcing the depleted region to span broader regions, also results in thinned equipotential lines and, hence, a weaker surface electric field.

Although achieving its objective, not even this prior approach is devoid of shortcomings. The presence of high-resistivity rings gives rise to peaks in the electric field near the interface between any two rings and at the edge of the outermost ring. Furthermore, the ring structure increases the space requirements of the device. In fact, a reduction in the surface electric field is made dependent on the number and the width of the high-resistivity rings. Accordingly, devices operated in a high voltage range require edge structures of large planar size.

SUMMARY OF THE INVENTION

An embodiment of the invention provides a device for high-voltage operation with protection structures effective to combine proper performance of the device through its operational range with reduced planar size, thereby overcoming the drawbacks of devices according to the prior art.

The device is an electronic power device with a protective structure of limited planar size by using trench structures of substantial thickness formed within the silicon substrate and completely filled with dielectric material. The presence of a trench in direct contact with the P/N junction is effective, in a reverse bias situation, to cause the equipotential lines to crowd together within the trench-filling dielectric material.

Since the critical (breakdown) electric field for the dielectric material, e.g., silicon oxide, is approximately $600V/\mu m$, whereas the critical electric field for silicon is approximately $20V/\mu m$, the oxide-filled trench structure can be made much smaller than edge structures according to the prior art.

As an example, a conventional edge structure for a power device which is to sustain a reverse bias voltage of 700V would account for approximately 40% of the device total area, whereas an edge structure according to this invention would be a planar size equal to about 10–15% of the device total area.

The features and advantages of the electronic device according to the invention will become more clearly apparent from the following description of an embodiment thereof, given by way of non-limitative example with reference to the accompanying drawings.

DETAILED DESCRIPTION

Figure 1:
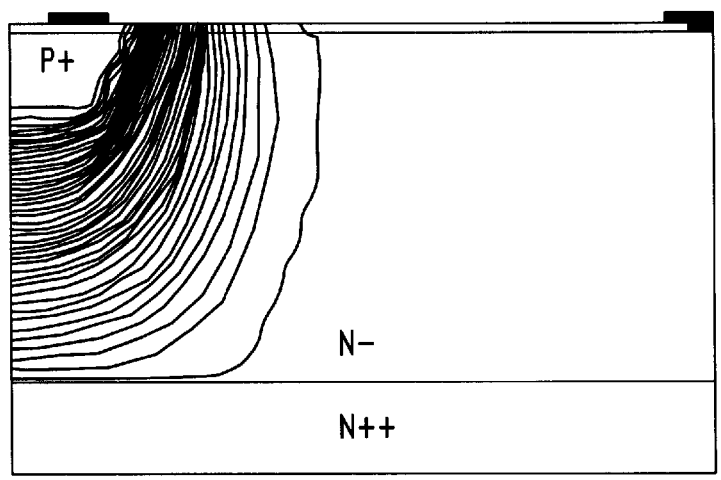
FIG. 1 illustrates in schematic form a simulation of a planar $P^+/N^-$ junction (as viewed across a section thereof) in a condition of reverse bias, showing the spatial distribution of the equipotential lines.
Figure 2:
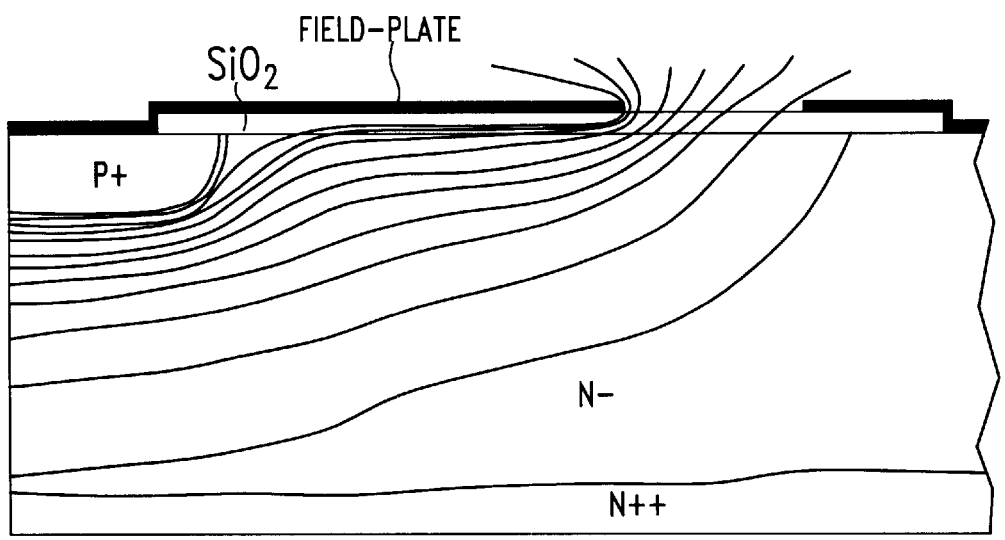
FIG. 2 illustrates in schematic form a simulation of a planar $P^+/N^-$ junction in a condition of reverse bias and in the presence of a metal field plate.
Figure 3:
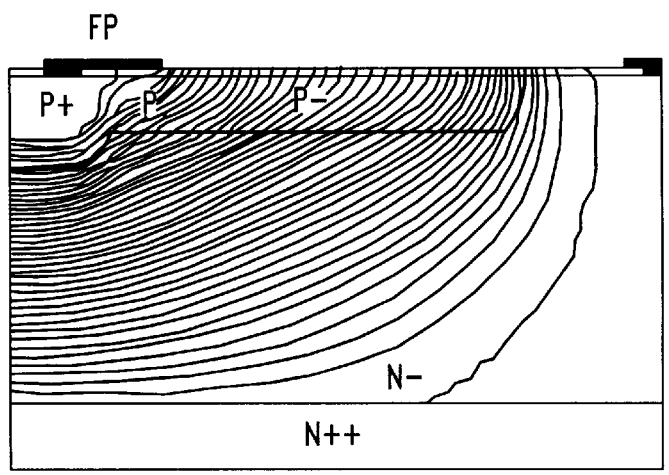
FIG. 3 illustrates in schematic form a simulation of a planar $P^+/N^-$ junction in a condition of reverse bias and in the presence of a high-resistivity ring (denoted by $P^-$)

Referring in particular to FIGS. 5, 6, 7 and 8, a method according to the invention for manufacturing—starting from an $N^+$ semiconductor substrate—a monolithically integrated, electronic power device of the VIPOWER type provided with a protective structure of substantial thickness and limited planar size, will now be described.

The process steps and the structures described hereinafter are not exhaustive of a process flow for manufacturing semiconductor power devices. The present invention can be implemented along with power device manufacturing techniques currently in use, and only such currently used process steps will be considered as are necessary to a proper understanding of this invention.

Figures showing cross-sectional views of a VIPOWER device during its fabrication are not drawn to scale, but rather to highlight major features of the invention.

An epitaxial layer 2 of the $N^-$ type is grown over the surface of an $N^+$ substrate 1. A region 3 of the P type, buried relative to the final surface of the device, is diffused into the epitaxial layer 2. Again by diffusion, a region 4 of the $N^+$ type is formed within the region 3 which will also be buried relative to the final surface of the device.

A second epitaxial layer 5 of the $N^-$ type is grown over the surface of the epitaxial layer 2. The substrate 1 constitutes, with the epitaxial layer 2 and the epitaxial layer 5, the bulk region of the transistor.

A thin oxide layer 6 is formed over the surface of the epitaxial layer, e.g., to a thickness of a few hundred Ångstrom. On top of this oxide layer 6, there may be deposited a layer 7 of a dielectric material, specifically silicon nitride, e.g., to a thickness of about one thousand Ångstrom.

Advantageously, a thick edge protection structure is provided having a silicon oxide trench of suitable dimensions to sustain operating voltages of up to 700V. In this case, the trench is 30 $\mu$m deep and 30 $\mu$m wide.

Figure 6:
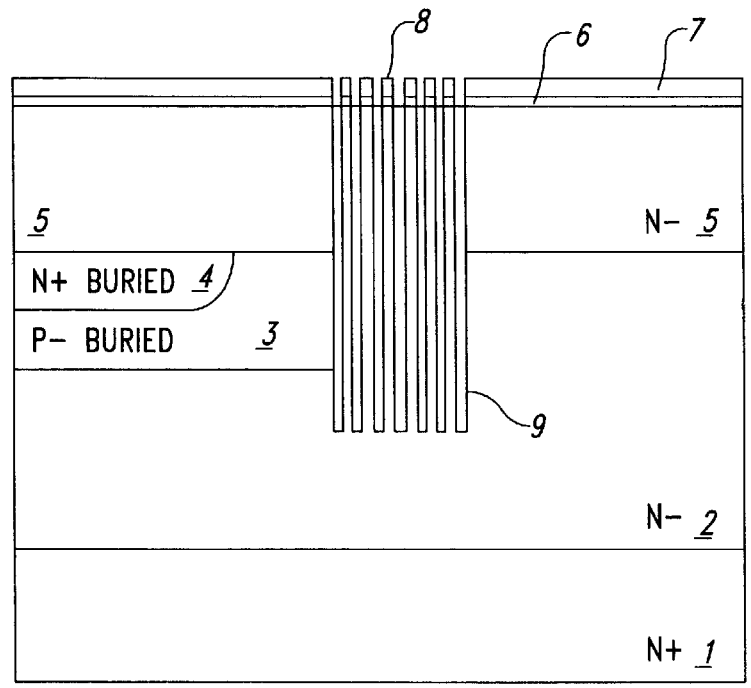
Figure 7:
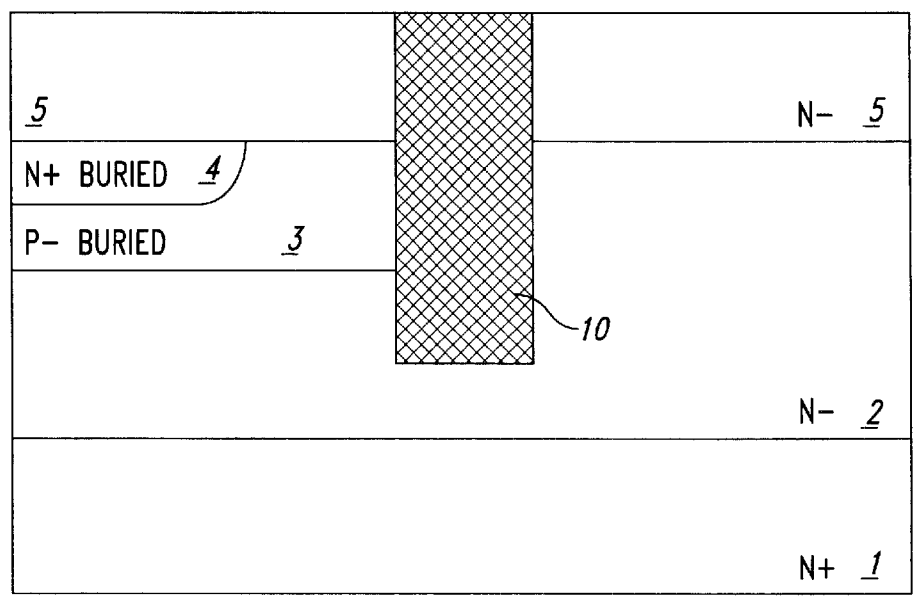

A plurality of small equispaced trenches 8 are formed in the layers 5 and 2, within the region where this protection structure is to be provided, as shown in FIG. 6, using conventional photolithographic techniques and successive etching processes through the layers 7 and 6, the epitaxial layer 5, and a portion of the epitaxial layer 2.

The small equispaced trenches 8 are parallel to one another. The regions of the small equispaced trenches 8 bound a plurality of walls 9 of semiconductor material.

These walls 9 extend parallel to the small equispaced trenches 8 and exhibit a comb-like profile when viewed in a vertical cross-section through at least two walls 9.

The nitride layer 7 is then removed from the structure, and the semiconductor is subjected to a thermal treatment in an oxidizing medium. The oxidizing thermal treatment should be adequate to turn all the silicon walls that delimit the trenches into oxide.

Figure 8:
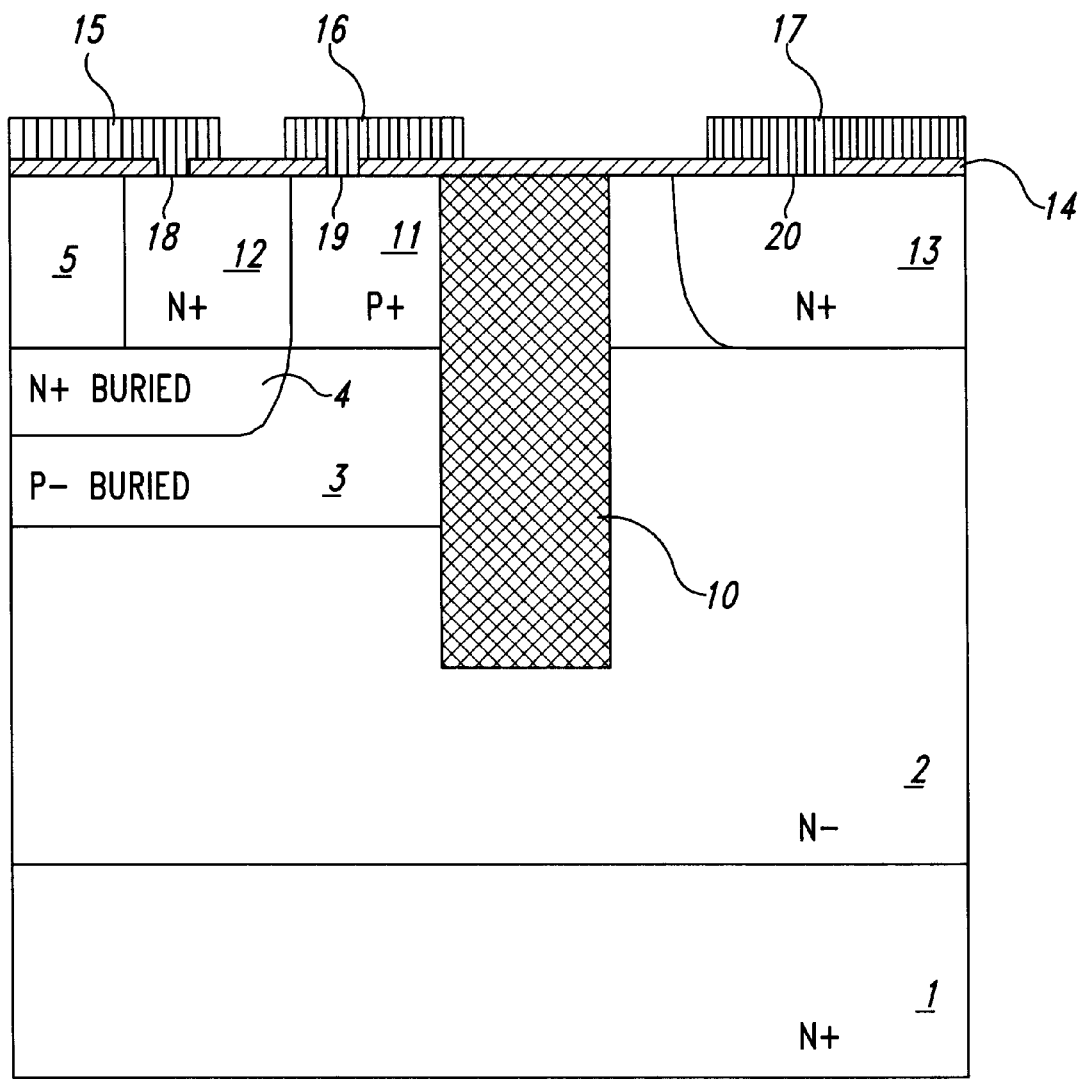

By suitable dimensioning of the small equispaced trenches 8, a single trench is obtained which is filled up by oxide as shown in FIG. 8.

Alternatively, where the oxidizing process yields no trench completely filled with oxide, a dielectric layer with planarizing properties can be deposited to fill the vacant trench regions.

In a preferred embodiment of the process according to the invention, these small equispaced trenches 8 are arranged to interrupt the buried region 3 of the P type, thereby providing a junction of the "mesa" type. In this way, the finished trench 10 will suppress the spiking effect.

It should be noted that this advantageous embodiment can only be implemented with a finished trench 10 which has been obtained from the plural small equispaced trenches 8 according to this invention, and is impracticable with a single trench obtained by filling in as in the prior embodiment.

An anisotropic planarizing etch-back is then carried out which may be followed by a planarizing process, e.g., of a chemio-mechanical nature.

Advantageously in this method, the top surface of the oxide-filled trench 10 and the surface of the layer 5 are coplanar, thus allowing the process flow for forming the power device to be carried out conventionally.

A region 11 of the $P^+$ type is formed by diffusion at the left-hand side of the oxide-filled trench which constitutes, in combination with the region 3, the base region of the NPN transistor. Furthermore, the region 11 locally improves the transistor base region such that the electric field can be reduced locally.

It should be noted that this region 11 need not be in contact with the trench 10 for the device to perform correctly.

Furthermore, this region 11 is not even strictly necessary; it has been introduced to establish a contact to the buried region P, and may be omitted where this contact is not required.

Two regions of the $N^+$ type are then formed by diffusion in the epitaxial layer 5, namely a region 12 and a region 13. The region 12 constitutes the emitter of the NPN transistor, and the region 13 constitutes the channel stopper.

The whole surface area is then covered with an insulating oxide 14, wherewithin contact areas are formed to enable the metal strips 15, 16, 17 to contact the regions 18, 19, 20, respectively.

Advantageously in this invention, the metallization layer 16 will not cover the trench 10, since it is not required to function as a field plate for straightening the field lines inside the junction.

Likewise, the metallization layer 17 extends to a distance short of the trench 10 which is dependent on the voltage sustaining specifications for the device.

Figure 4:
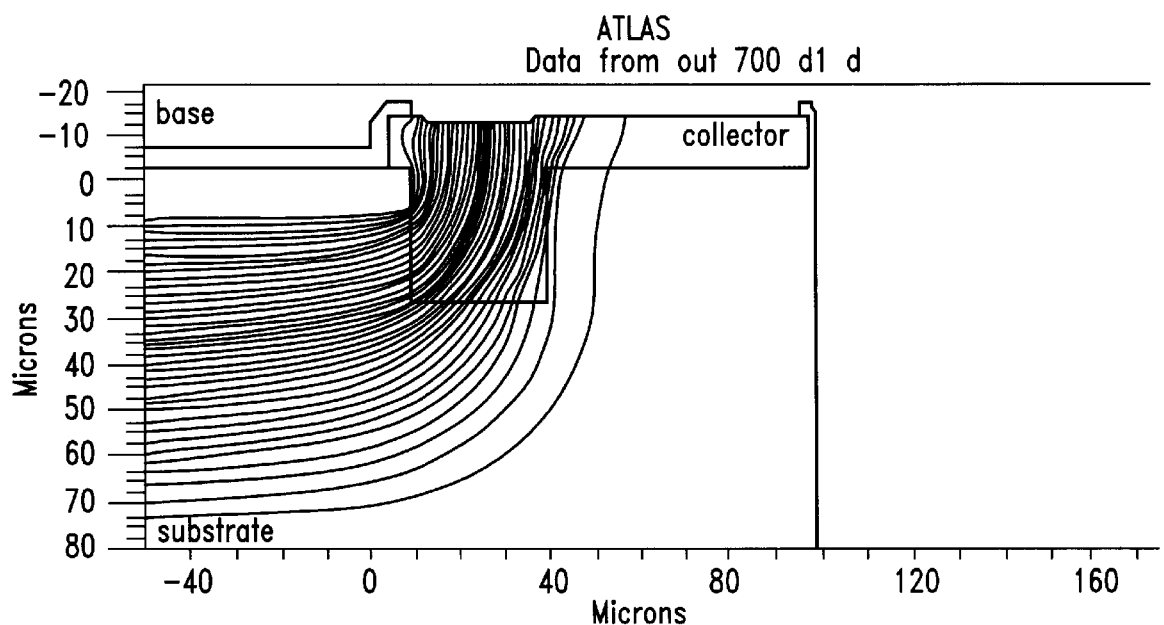
FIG. 4 illustrates in schematic form a simulation of a planar $P^+/N^-$ junction in a condition of reverse bias and in the presence of an edge structure consisting of a silicon trench filled with silicon oxide to a substantial thickness, according to the invention.
Figure 5:
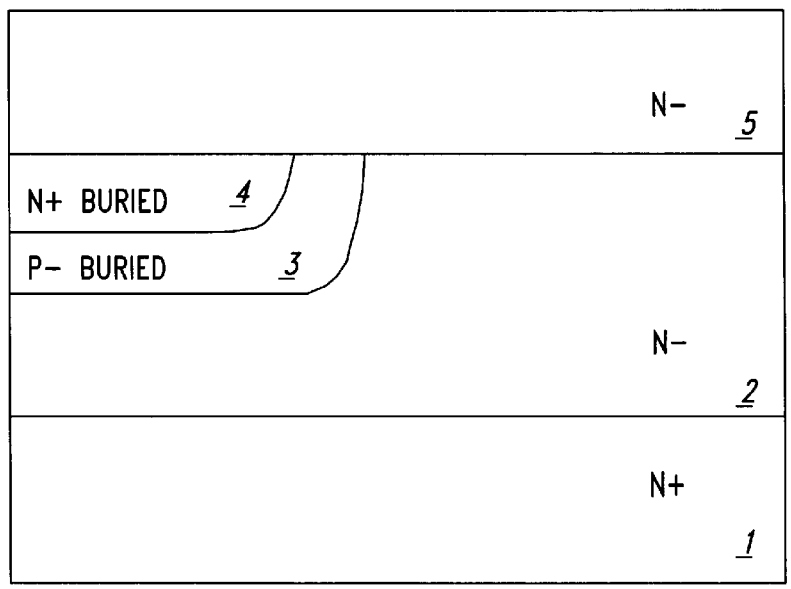
FIGS. 5 to 8 are partial cross-sectional views of a VIPOWER device at various stages of a process according to the invention.

FIG. 4 shows the arrangement of the equipotential lines when the device of FIG. 8 is exposed to an electric field. As seen, the lines are substantially equally spaced outside of the trench 10 and become crowded only within the trench 10.

It should be noted that the effectiveness of the trench structures according to the invention is only of importance where the depth of such structures exceeds the depth of the junction to be protected.

Figure 9:
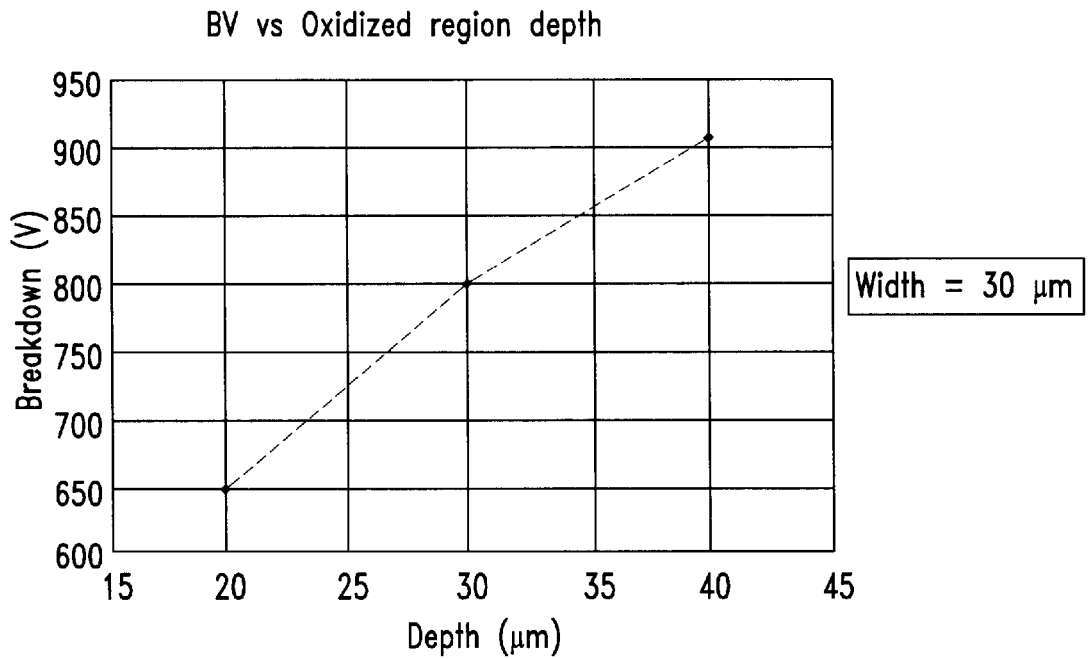
FIGS. 9 and 10 illustrate graphically the dependence of the junction breakdown voltage on the varying depth and width of the trench structure.
Figure 10:
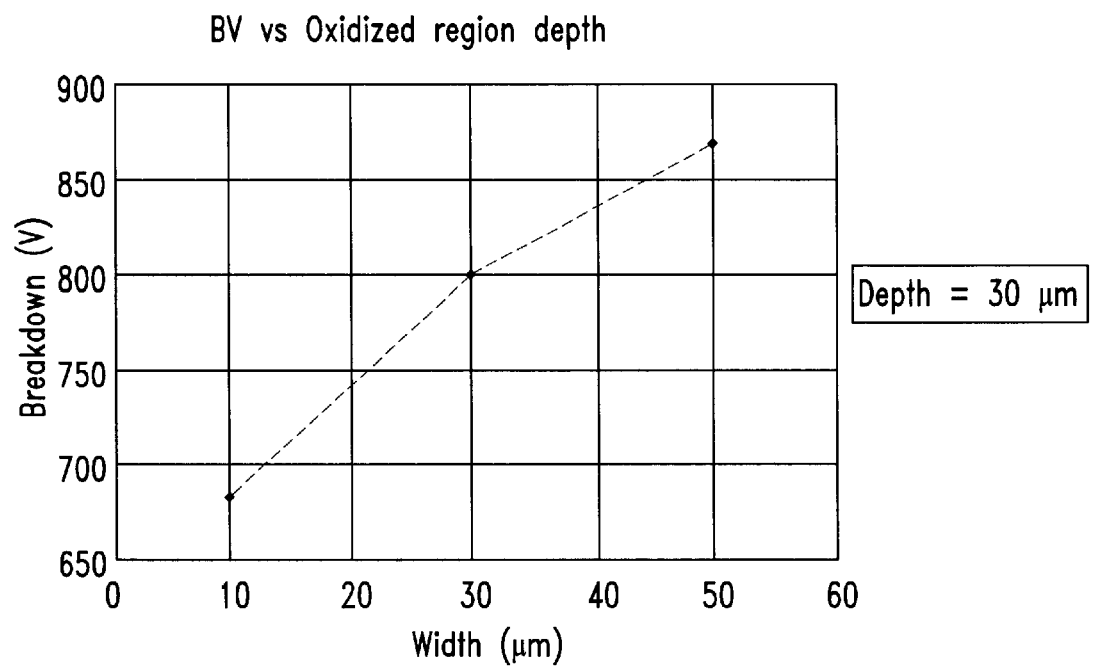

In particular, FIGS. 9 and 10 illustrate graphically the dependence of the breakdown voltage of the junction on the varying depth (FIG. 9) and breadth (FIG. 10) of the trench structure.

The Applicant has plotted the graphs in FIGS. 9 and 10 by subjecting to simulation substrates with the following specifications:

junction "curvature" voltage in the 600V range;

breakdown voltage of the "planar" junction in the 1150V range.

It can be readily seen from these graphs that, as the size of the trench structure employed increases, the breakdown voltage, and hence the efficiency of the edge structure, also increases. In this respect, creating trenches with some particular shape, from a plurality of small equispaced trenches having different lengths, is not recommended.

While a single structure of this invention has been described, it is understood that many changes and modifications may be made thereunto without departing from the invention scope.

What is claimed is:

1. An electronic power device integrated monolithically in a semiconductor substrate, comprising a power region, itself having a P/N junction provided therein which comprises a first semiconductor region with a first type of conductivity extending into the substrate from a top surface of the device and being diffused into a second semiconductor region with the opposite conductivity from the first; and an edge protection structure of substantial thickness and limited planar size incorporating a trench filled with dielectric material and lying adjacent to said power region.

2. An electronic device according to claim 1, further comprising an epitaxial semiconductive layer deposited onto the semiconductor substrate, wherein said trench extends deeper than the epitaxial layer, from the device top surface.

3. An electronic device according to claim 1, wherein said trench depth is equal to or greater than the depth of said P/N junction.

4. An electronic device according to claim 1, wherein said dielectric-filled trench is placed in direct contact with the PN junction.

5. An electronic device according to claim 1, wherein the dielectric in said trench is silicon oxide.

6. An electronic device according to claim 1, further comprising a metallization layer covering a P side of the P/N junction but not the trench itself.

7. An electronic device according to claim 1, further comprising a metallization layer covering an N side of the P/N junction but not the trench itself.

8. A method of manufacturing an electronic power device integrated monolithically in a semiconductor substrate, including at least one power region, itself having at least one P/N junction provided therein which comprises a first semiconductor region with a first type of conductivity extending into the substrate from the top surface of the device and being diffused into a second semiconductor region with the opposite conductivity from the first, comprising forming a silicon oxide trench, provided as an edge protection structure, by the following steps:

forming a plurality of small trenches in the substrate which have predetermined lengths and are bounded by a plurality of corresponding walls of semiconductor material having predetermined widths; and oxidizing the semiconductor by a thermal process in order to oxidize said walls and produce the oxide trench adjacent to said power region.

9. A method of manufacturing an electronic device according to claim 8, wherein the ratio of said length to said width is such that the small trenches exit the oxidizing thermal process completely filled with oxide.

10. A method of manufacturing an electronic device according to claim 8, further comprising depositing a dielectric layer with planarizing properties to fill the regions of the small trenches.

11. A method of manufacturing an electronic device according to claim 8, further comprising a planarizing process.

12. A method of manufacturing an electronic device according to claim 8, wherein the formation of said plurality of small trenches interrupts said second semiconductor region, thereby providing a junction of the so-called mesa type.

* * * * *